United States Patent
Sin et al.

(10) Patent No.: US 8,427,355 B2
(45) Date of Patent: Apr. 23, 2013

(54) TIME-INTERLEAVED PIPELINED-SAR ANALOG TO DIGITAL CONVERTER WITH LOW POWER CONSUMPTION

(75) Inventors: Sai-Weng Sin, Macau (CN); Li Ding, Macau (CN); Yan Zhu, Macau (CN); He-Gong Wei, Macau (CN); Chi-Hang Chan, Macau (CN); U-Fat Chio, Macau (CN); Seng-Pan U, Macau (CN); Rui Paulo da Silva Martins, Macau (CN); Franco Maloberti, Torre d'Isola (IT)

(73) Assignee: University of Macau, Macau (CN)

( * ) Notice: Subject to any disclaimer, the term of this patent is extended or adjusted under 35 U.S.C. 154(b) by 31 days.

(21) Appl. No.: 13/232,442

(22) Filed: Sep. 14, 2011

(65) Prior Publication Data
US 2012/0229313 A1    Sep. 13, 2012

(30) Foreign Application Priority Data

Mar. 8, 2011 (TW) .............................. 100107757 A

(51) Int. Cl.
*H03M 1/38* (2006.01)
(52) U.S. Cl.
USPC ........... 341/161; 330/252; 330/310; 330/251; 330/260; 330/302; 324/658; 327/91; 377/70; 377/75; 377/76; 341/143; 341/156; 341/136

(58) Field of Classification Search .......... 341/136–161; 330/251, 252, 260, 302, 310; 324/658; 327/91; 377/70, 75, 76
See application file for complete search history.

(56) References Cited

U.S. PATENT DOCUMENTS

| | | | | |
|---|---|---|---|---|
| 4,940,981 | A * | 7/1990 | Naylor et al. ................. | 341/161 |
| 5,661,483 | A * | 8/1997 | Negahban et al. ............ | 341/161 |
| 7,764,215 | B2 * | 7/2010 | Wan et al. ..................... | 341/161 |
| 7,965,218 | B2 * | 6/2011 | Ohnhaeuser et al. ......... | 341/161 |
| 7,999,719 | B2 * | 8/2011 | Jeon et al. ..................... | 341/161 |

OTHER PUBLICATIONS

Sai-Weng Sin, Li Ding, Yan Zhu, He-Gong Wei, Chi-Hang Chan, U-Fat Chio, Seng-Pan U, R.P.Martins, F.Maloberti, "An 11b 60MS/S 2.1mW Two-Step Time-Interleaved SAR-ADC with Reused S&H," in Proc. of IEEE European Solid-State Circuits Conference—ESSCIRC 2010, Seville, Spain, Sep. 2010.

* cited by examiner

*Primary Examiner* — Lam T Mai
(74) *Attorney, Agent, or Firm* — Bacon & Thomas, PLLC

(57) ABSTRACT

An analog-to-digital converter (ADC) circuit comprising two time-interleaved successive approximation register (SAR) ADCs. Each of the two time-interleaved SAR ADCs comprises a first stage SAR sub-ADC, a residue amplifier, a second stage SAR sub-ADC and a digital error correction logic. The residue amplifier is shared between the time-interleaved paths, has a reduced gain and operates in sub-threshold to achieve power effective design.

5 Claims, 3 Drawing Sheets

TIME-INTERLEAVED PIPELINED-SAR ANALOG TO DIGITAL CONVERTER WITH LOW POWER CONSUMPTION

FIELD OF THE INVENTION

The present invention relates to an analog to digital converter (ADC), and more specifically to a two-step time-interleaved successive approximation register (SAR) ADCs.

RELATED ART

Typically, an analog-to-digital converter (ADC) is used to convert an input analog voltage (or current) to a digital number proportional to the magnitude of the voltage or current.

A pipelined ADC is a type of ADC including sequence of stages with each stage containing a sub-ADC that generates a residue signal needed to be amplified as an input to the next stage.

The power effectiveness of a traditional two-step or pipelined ADC drops for resolution higher than 10-bit and the sampling rate of 50-100 MS/s because of the power required by the op-amp(s). The problem becomes more evident with nanometer CMOS technologies because high-gain op-amps are difficult to design. With resolution less than 10-bit, a SAR ADC has high power performance with sampling rate around 50 MS/s. However, when the resolution goes above 10-bit and the speed is several tens of MHz, the power performance drops sharply. There is a need to provide a power effective ADC to solve this problem.

SUMMARY OF THE INVENTION

Therefore, the object of the present invention is to provide a low power consumption ADC.

According to one embodiment of the present invention, an analog-to-digital converter (ADC) circuit comprises multiple time-interleaved successive approximation register (SAR) ADCs. Each of the multiple time-interleaved SAR ADCs comprises: a first stage SAR sub-ADC for coarse conversion, the first stage SAR sub-ADC receiving and converting an analog input signal to generate a first digital code and a residue signal; a residue amplifier for amplifying the residue signal generated by the first stage SAR sub-ADC to output an amplified residue signal, wherein the residue amplifier is shared between the multiple time-interleaved SAR ADCs; a second stage SAR sub-ADC for fine conversion, the second stage SAR sub-ADC receiving and converting the amplified residue signal to generate a second digital code; and a digital error correction logic for receiving and combining the first digital code generated by the first stage SAR sub-ADC and the second digital code generated by the second stage SAR sub-ADC to generate digital representation of the analog input signal. The residue amplifier is a single-stage operation amplifier having a low gain and operating in sub-threshold. The gain of the residue amplifier is less than 32 so that the requirements of the gain, the signal amplitude, the noise, the accuracy, the power consumption and the speed of the residue amplifier are relaxed. Preferably, the gain of the residue amplifier is 8.

The first stage SAR sub-ADC comprises a digital to analog converter (DAC) and the digital to analog converter includes a capacitor array that has triple usage to perform input sampling, SAR sub-ADC conversion and residue generation so that input capacitive load, chip area and power consumption can be reduced as a result of elimination of extra capacitor arrays.

The residue amplifier in the sub-threshold operates at a 1-V supply.

DETAILED DESCRIPTION

A preferred embodiment of the present invention will be described hereinafter with reference to the accompanying drawings.

Figure 1:
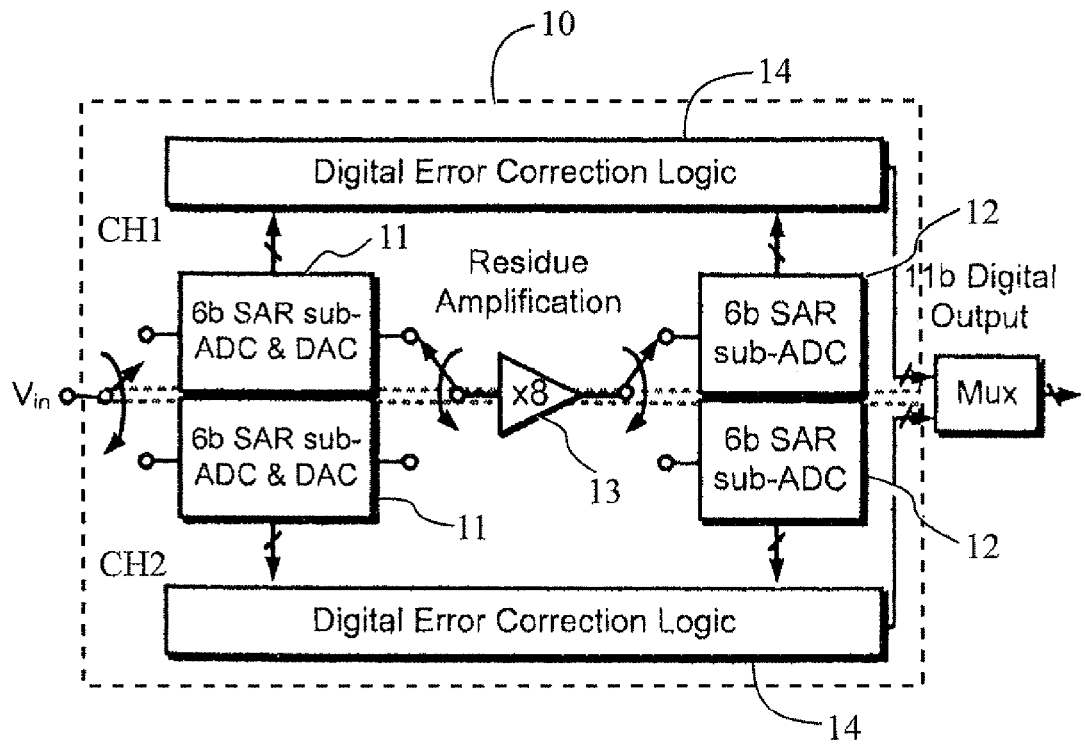
FIG. 1 is a block diagram of an analog to digital converter (ADC) according to an embodiment of the present invention.

Reference is now made to FIG. 1. FIG. 1 is a block diagram of an analog to digital converter (ADC) according to an embodiment of the present invention. A two-step time-interleaved successive approximation register (SAR) ADC circuit 10 with 11-bit resolution and 60 MS/s sampling rate is shown in FIG. 1. The ADC circuit 10 includes two time-interleaved two-step SAR ADCs. Each of the SAR ADCs comprises a first stage SAR sub-ADC 11, a second stage SAR sub-ADC 12, a residue amplifier 13 and a digital error correction logic 14.

The first stage SAR sub-ADC 11, which is a 6-bit ADC, receives an analog input signal $V_{in}$ and converts the analog input signal $V_{in}$ to generate a 6-bit digital code. Thus, the first stage SAR sub-ADC 11 converts the coarse 6-bit code. The first stage SAR sub-ADC 11 also generates a residue signal to be amplified by the residue amplifier 13 for the next stage fine conversion.

The residue amplifier 13 is a single-stage op-amp with a gain of 8 and amplifies the residue signal generated by the first stage SAR sub-ADC 11. The amplified residue signal is then provided as an input to the second stage SAR sub-ADC 12. The residue amplifier 13 is shared by the two time-interleaved two-step SAR ADCs. That is, the two time-interleaved two-step SAR ADCs use the same residue amplifier.

The gain of the residue amplifier should be normally 32 to comply with the 6-bit of the first stage SAR sub-ADC 11. However, high output swing in the op-amp would constrain the low-voltage op-amp architecture. A suitable trade-off is to use a gain of 8. With the reduced gain of 8, the residue amplifier 13 has a low output swing, the benefit is that the requirements of the gain, the signal amplitude, the noise, the accuracy, the power consumption, the speed and the swing of the op-amp are all relaxed with respect to what 32× amplification needs. The low output swing enables using a telescopic gain-boosted cascode, shared between the time-interleaved paths.

The second stage SAR sub-ADC 12, which is a 6-bit ADC, receives the amplified residue signal from the residue amplifier 13 and converts the amplified residue signal to generate a 6-bit digital code. Thus, the second stage SAR sub-ADC 12 converts the fine 6-bit code.

The digital error correction logic 14 receives and combines the coarse 6-bit digital code generated by the first stage SAR sub-ADC 11 and the fine 6-bit digital code generated by the second stage SAR sub-ADC 12 to output a 11-bit digital code to a multiplexer. The comparator offset in the first stage SAR sub-ADC 11 and the second stage SAR sub-ADC 12 can be corrected by use of the digital error correction logic 14.

Figure 2:
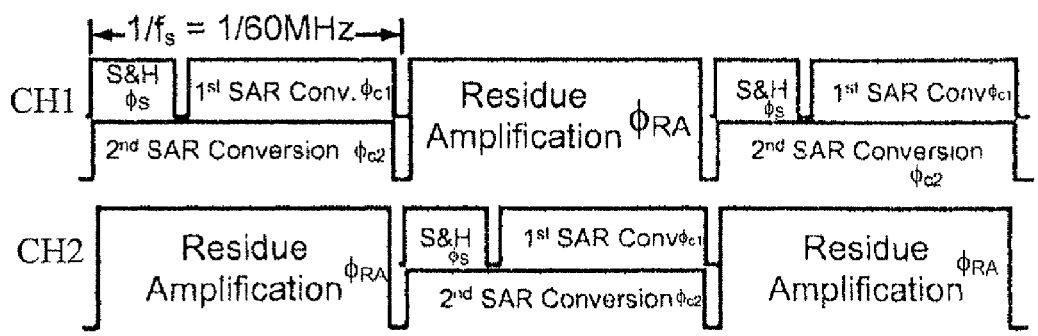
FIG. 2 is a timing diagram illustrating the time relationship of the operation of the analog to digital converter in FIG. 1.
Figure 3:
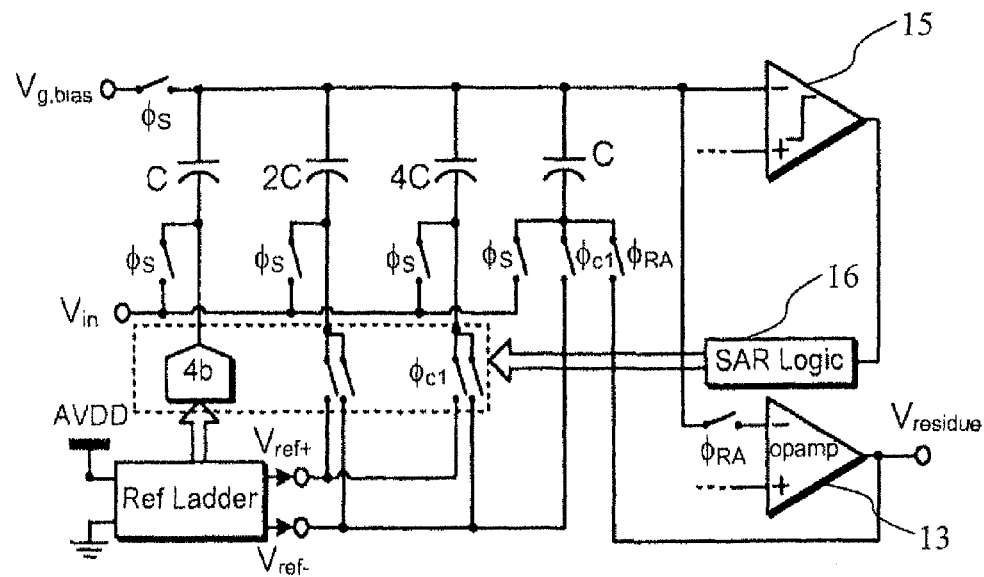
FIG. 3 is a block diagram of a first stage SAR sub-ADC and a residue amplifier according to an embodiment of the present invention.

Reference is now made to FIGS. 2 and 3. FIG. 2 is a timing diagram illustrating the time relationship of the operation of the ADC circuit 10 in FIG. 1. FIG. 3 is a block diagram of the first stage SAR sub-ADC 11 with the residue amplifier 13 in FIG. 1.

In FIG. 3, the first stage SAR sub-ADC 11 comprises a 6-bit digital to analog converter (DAC), a comparator 15, a successive approximation register (SAR) logic 16. As shown in FIG. 3, an array of 8 unity capacitors and a 4-bit reference ladder circuit make the 6-bit DAC.

In the SAR architecture of the first stage SAR sub-ADC 11, the SAR logic 16 operates to control the output of the 6-bit DAC and outputs the coarse 6-bit digital code to the digital error correction logic 14. The residue signal to be amplified by the residue amplifier 13 is generated by the 6-bit DAC.

A process-tracked biasing network (not shown) generates $V_{g,bias}$ for setting the proper value of the input common-mode voltage. The DAC capacitor array (the 8 unity capacitors array) is pre-charged to the input signal during time-slot $\Phi_S$. Then, the 6-bit SAR conversion is performed during the remaining time slot $\Phi_{C1}$. At the end of the conversion, the residue charge remains on the top-plate of the DAC capacitor array. That charge is integrated on a unity capacitance of the DAC capacitor array for performing the 8× residue amplification during time slot $\Phi_{R4}$.

The residue amplifier 13 is shared between the two time-interleaved paths. The time-interleaving enables a double use of the DAC capacitor array of the first stage SAR sub-ADC 11. That is, the DAC capacitor array operates to perform the input sampling, SAR sub-ADC conversion and the residue generation. Therefore, the signal sampled for coarse conversion is reused for the residue generation. Only one capacitor array is needed to achieve the sampling, the ADC conversion, the DAC conversion and the residue amplification in the first stage SAR sub-ADC 11. This feature reduces the input capacitive load and power consumption and avoids error caused by clock misalignment in sampling the input for the coarse conversion and the fine conversion. The S/H reuse allow the use of bigger unity capacitance that improves the interleave path matching.

Figure 4:
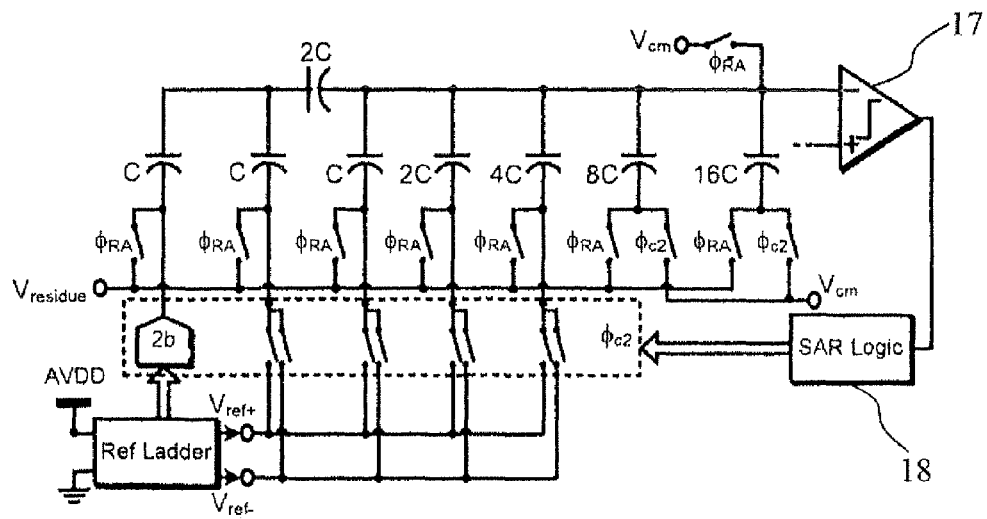
FIG. 4 is a block diagram of a second stage SAR sub-ADC according to an embodiment of the present invention.

Reference is now made to FIG. 4. FIG. 4 shows the second stage SAR sub-ADC 12. In FIG. 4, the second stage SAR sub-ADC 12 comprises a 6-bit digital to analog converter (DAC), a comparator 17, a successive approximation register (SAR) logic 18. As shown in FIG. 4, an array of capacitors and a 2-bit reference ladder circuit make the 6-bit DAC. The capacitors 8C and 16C are not part of the second stage SAR sub-ADC 12 but perform a scaling by 4 of the reference voltages as required by the lower inter-stage gain of residue amplifier 13.

In the SAR architecture of the second stage SAR sub-ADC 12, the SAR logic 18 operates to control the output of the 6-bit DAC and outputs the fine 6-bit digital code to the digital error correction logic 14. The second stage SAR sub-ADC 12 performs the conversion during time slot $\Phi_{C2}$.

Figure 5:
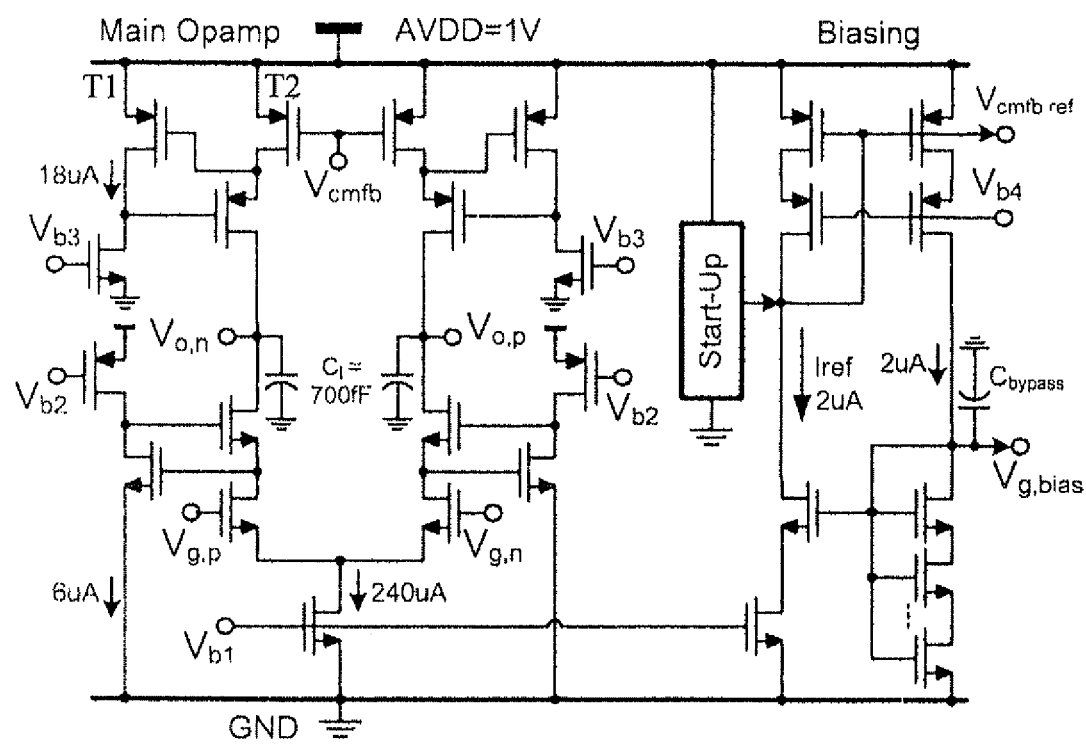
FIG. 5 is circuit schematic of the residue amplifier according to an embodiment of the present invention.

Reference is now made to FIG. 5. FIG. 5 shows the circuit schematic of the residue amplifier 13. The residue amplifier 13 operates in sub-threshold. In the residue amplifier 13, the transistors are kept in the sub-threshold, thus minimizing overheads and making possible a 1-V supply. Thanks to the sub-threshold operation, the gate-source voltage ($V_{GS}$) of the transistor T1 can be set quite close to the override voltage ($V_{OD}$) of the transistor T2 so that the headroom needed by the telescopic gain-boosted op-amp is not increased. The reduction of gain and the sub-threshold operation in the residue amplifier 13 enable the use of a power-effective, single-stage op-amp.

In summary, the present invention provides low power consumption time-interleaved two-step SAR ADCs whose optimal region of operation is in the higher resolution and the higher speed range instead of single-step dynamic SAR DAC whose optimal region of operation is in the medium resolution and the lower speed range. In the present invention, the single-stage residue amplifier shared between the time-interleaved paths has a reduced gain of 8 and operates in sub-threshold to achieve the power effective design.

The present invention is not limited to the above description. One skilled in the art may make various modifications to the details of the embodiment without departing from the scope and the spirit of the present invention.

What is claimed is:

1. An analog-to-digital converter (ADC) circuit, comprising:
multiple time-interleaved successive approximation register (SAR) ADCs, each of the multiple time-interleaved SAR ADCs comprising:
a first stage SAR sub-ADC for coarse conversion, the first stage SAR sub-ADC receiving and converting an analog input signal to generate a first digital code and a residue signal;
a residue amplifier for amplifying the residue signal generated by the first stage SAR sub-ADC to output a amplified residue signal, wherein the residue amplifier is shared between the multiple time-interleaved SAR ADCs;
a second stage SAR sub-ADC for fine conversion, the second stage SAR sub-ADC receiving and converting the amplified residue signal to generate a second digital code; and
a digital error correction logic for receiving and combining the first digital code generated by the first stage SAR sub-ADC and the second digital code generated by the second stage SAR sub-ADC to generate digital representation of the analog input signal;
wherein the residue amplifier is a single-stage operation amplifier having a low gain and operating in sub-threshold.

2. The analog-to-digital converter circuit according to claim 1, wherein the low gain of the residue amplifier is less than 32 so that the requirements of the gain, the signal amplitude, the noise, the accuracy, the power consumption and the speed of the residue amplifier are relaxed.

3. The analog-to-digital converter circuit according to claim 2, wherein the low gain of the residue amplifier is 8.

4. The analog-to-digital converter circuit according to claim 1, wherein the first stage SAR sub-ADC comprises a digital to analog converter (DAC) and the digital to analog converter includes a capacitor array that has triple usage to perform input sampling, SAR sub-ADC conversion and residue generation so that input capacitive load, chip area and power consumption can be reduced.

5. The analog-to-digital converter circuit according to claim 1, wherein the residue amplifier in the sub-threshold operates at a 1-V supply.

* * * * *